(12) United States Patent
Kraus et al.

(10) Patent No.: US 12,300,959 B2
(45) Date of Patent: May 13, 2025

(54) OPTICAL ASSEMBLY FOR REDUCING A SPECTRAL BANDWIDTH OF AN OUTPUT BEAM OF A LASER

(71) Applicant: Carl Zeiss SMT GmbH, Oberkochen (DE)

(72) Inventors: Johannes Kraus, Theilheim (DE); Oliver Gloeckl, Aalen (DE); Markus Deubel, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 943 days.

(21) Appl. No.: 17/117,824

(22) Filed: Dec. 10, 2020

(65) Prior Publication Data

US 2021/0098958 A1    Apr. 1, 2021

Related U.S. Application Data

(63) Continuation of application No. PCT/EP2019/063857, filed on May 28, 2019.

(30) Foreign Application Priority Data

Jun. 14, 2018  (DE) .......................... 102018209602.3

(51) Int. Cl.
  *H01S 3/0805* (2023.01)
  *H01S 3/08* (2023.01)
  *H01S 3/225* (2006.01)

(52) U.S. Cl.
  CPC ........ *H01S 3/0805* (2013.01); *H01S 3/08009* (2013.01); *H01S 3/08068* (2013.01); *H01S 3/225* (2013.01)

(58) Field of Classification Search
  CPC .................................................. H01S 3/08009
  See application file for complete search history.

(56) References Cited

U.S. PATENT DOCUMENTS 5,489,984 A   2/1996  Hariharan et al.
5,559,816 A   9/1996  Basting et al.
                        (Continued)

FOREIGN PATENT DOCUMENTS

CN    861 03 373 A    11/1987
CN    207 0 955 U      2/1991
                        (Continued)

OTHER PUBLICATIONS

Daniel Hahn Calcium Fluoride and Barium Fluoride Crystals in Optics, Apr. 2014, https://onlinelibrary.wiley.com/doi/pdf/10.1002/opph.201400066 (Year: 2014).*

(Continued)

*Primary Examiner* — Minsun O Harvey
*Assistant Examiner* — Stephen Sutton Kotter
(74) *Attorney, Agent, or Firm* — Fish & Richardson P.C.

(57) ABSTRACT

An optical assembly reduces a spectral bandwidth of an output beam of a laser. The assembly includes a beam-expanding optical unit within a laser resonator. The latter serves to increase a beam cross section of a resonator-internal laser beam in at least one expansion cross-sectional dimension such that at least one resonator-internal expansion laser beam section arises. The assembly also includes an optical grating in a retroreflective arrangement for the resonator-internal laser beam. A beam-limiting stop acts in the expansion cross-sectional dimension and is arranged in the beam path of the expansion laser beam section. This yields an optical assembly in which unwanted thermal effects on account of optical components of the optical assembly heating during laser operation due to a local power density of the resonator-internal laser beam are reduced or avoided.

18 Claims, 5 Drawing Sheets

(56) References Cited

U.S. PATENT DOCUMENTS

| | | | |
|---|---|---|---|
| 5,597,670 A | 1/1997 | Aketagawa et al. | |
| 5,898,725 A | 4/1999 | Fomenkov et al. | |
| 6,285,701 B1 | 9/2001 | Albrecht et al. | |
| 6,496,528 B2 | 12/2002 | Titus et al. | |
| 6,603,788 B1* | 8/2003 | Vogler | H01S 3/106 372/100 |
| 6,606,338 B1 | 8/2003 | Kraenert | |
| 6,785,319 B1* | 8/2004 | Ariga | H01S 3/134 372/100 |
| 7,899,095 B2 | 3/2011 | Partlo | |
| 8,379,687 B2 | 2/2013 | Cybulski et al. | |
| 2002/0031161 A1 | 3/2002 | Albrecht et al. | |
| 2008/0253413 A1 | 10/2008 | Partlo | |
| 2011/0304837 A1 | 12/2011 | Patra | |
| 2012/0099612 A1 | 4/2012 | Deubel et al. | |
| 2013/0315270 A1* | 11/2013 | Kumazaki | H01S 3/10069 372/20 |
| 2014/0126603 A1 | 5/2014 | Della-Pergola et al. | |

FOREIGN PATENT DOCUMENTS

| | | |
|---|---|---|
| CN | 102 317 868 A | 1/2012 |
| CN | 102 983 485 A | 3/2013 |
| CN | 104 254 950 A | 12/2014 |
| DE | 10 2005 016 200 A1 | 9/2005 |
| DE | 69832365 T2 | 6/2006 |
| DE | 102009020501 | 12/2010 |
| JP | H04-211108 A | 8/1992 |
| JP | H08-43534 A | 2/1996 |
| JP | H10-209548 A | 8/1998 |
| JP | 2001-77449 A | 3/2001 |
| JP | 2007-96359 A | 4/2007 |
| JP | 2010-524256 A | 7/2010 |
| JP | 2014-522582 A | 9/2014 |
| JP | 2017-208557 A | 11/2017 |

OTHER PUBLICATIONS

International Search Report issued in related International Application No. PCT/EP2019/063857, on Aug. 22, 2019, 4 pages.

German Patent and Trade Mark Office Examination Report, including English translation, issued in related Application No. DE 10 2018 209 602.3 on Jan. 30, 2019, 11 pages.

Japanese Office Action, with translation thereof, for corresponding JP Appl No. 2020-569769, dated Dec. 13, 2021.

Chinese Office Action and Search Report, with English translation, for corresponding CN Appl No. 2019 8003 9591.4, dated Jun. 5, 2023.

* cited by examiner

OPTICAL ASSEMBLY FOR REDUCING A SPECTRAL BANDWIDTH OF AN OUTPUT BEAM OF A LASER

CROSS-REFERENCE TO RELATED APPLICATIONS

The present patent application is a continuation of, and claims priority under 35 USC § 120 to, international patent application PCT/EP 2019/063857, filed May 28, 2019, which claims German patent application DE 10 2018 209 602.3, filed Jun. 14, 2018. The contents of these applications are incorporated by reference herein.

FIELD

The disclosure relates to an optical assembly for reducing a spectral bandwidth of an output beam of a laser. Further, the disclosure relates to a bandwidth-limited laser with such an assembly.

BACKGROUND

A bandwidth-limited laser with an optical assembly of the type set forth at the outset is known from U.S. Pat. No. 6,496,528 B2, U.S. Pat. No. 7,899,095 B2 and U.S. Pat. No. 8,379,687 B2. DE 10 2009 020 501 A1 has disclosed a bandwidth narrowing module for setting a spectral bandwidth of a laser beam.

SUMMARY

The present disclosure seeks to develop an optical assembly for reducing a spectral bandwidth of a laser beam, in such a way that unwanted thermal effects on account of inhomogeneous heating of optical components of the optical assembly during the laser operation due to a local power density of a resonator-internal laser beam are reduced or avoided.

U.S. Pat. No. 6,785,319 B1 discloses a UV laser with a beam-expanding optical unit including two prisms. U.S. Pat. No. 6,285,701 B1 discloses a laser resonator for improving a narrowband emission of an excimer laser. US 2008/0253413 A1 discloses a laser-based lithography system with improved bandwidth control.

In an aspect, the disclosure provides an optical assembly for reducing a spectral bandwidth of an output beam of a laser, including: a beam-expanding optical unit arranged within a laser resonator, for increasing a beam cross section and reducing the divergence of a resonator-internal laser beam in at least one expansion cross-sectional dimension such that at least one resonator-internal expansion laser beam section arises; an optical grating in a retroreflective arrangement for the resonator-internal laser beam; a beam-limiting stop, which acts in the expansion cross-sectional dimension, in the beam path of the expansion laser beam section; and an additional input beam-limiting stop in the beam path of the resonator-internal laser beam on a side of the beam-expanding optical unit facing away from the grating. The width of the additional input beam-limiting stop is chosen such that the beam-limiting stop arranged in the expansion laser beam section is overexposed by the resonator-internal laser beam and that the width of a used beam cross section on the grating is defined by the beam-limiting stop arranged in the expansion laser beam section. An adjustment range of the beam-expanding optical unit and a width of an input aperture of the input beam-limiting stop are matched to one another in such a way that the beam-limiting stop is fully illuminated in the case of the smallest expansion and the beam-limiting stop is overexposed with an increasing expansion.

Laser light incident on the optical assembly is only guided in amplifying fashion into a resonator of the laser by the optical grating, which might be arranged in the Littrow configuration, if the wavelength of the resonator-internal laser beam satisfies the grating equation. What wavelength is guided in amplifying fashion into the beam path of the resonator-internal laser beam depends on the angle at which the laser beam is incident on the optical grating. In general, the greater the angle distribution of the laser beam incident on the grating, the greater the spectral bandwidth of the output beam. Thus, the generation of an output beam with a small bandwidth generally involves a small angle distribution, i.e., a narrow angle spectrum, in the resonator-internal laser beam incident on the optical grating. In the optical assembly, a reduction in the angle-of-incidence distribution can be achieved by virtue of the resonator-internal laser beam being expanded in the direction transverse to the propagation direction of the resonator-internal laser beam, i.e., in a lateral direction, with the aid of the beam-widening optical unit prior to the incidence on the optical grating. This expansion reduces the divergence, and hence the angle distribution, of the resonator-internal laser beam.

According to the disclosure, it was recognized that an element, which delimits the beam width, in the form of a beam-limiting stop in the beam path of an expansion laser beam section of a beam-expanding optical unit, i.e., in the beam path between the grating and the beam-expanding optical unit or within the beam-expanding optical unit, can lead to the option of specifying a used beam cross section within a resonator of the laser in such a way that a temperature profile, which is linked to the impingement cross section of the resonator-internal laser beam, in or on the optical components of the optical assembly has no temperature gradient, or a small temperature gradient, within the used beam cross section. The expansion laser beam section is a resonator-internal beam section, in which the resonator-internal laser beam is expanded in the lateral direction. It is therefore possible that local thermal expansions of the optical components or thermally induced refractive index gradients in the optical material or in the surrounding purge gas then do not lead to substantial disturbance of the wavefront within the used beam cross section of the resonator-internal laser beam, or unwanted wavefront disturbances on account of such a temperature gradient due to residual absorption of the optical components are thus minimized or entirely avoided. The optical assembly can then generate its bandwidth-reducing effect largely independently of the resonator-internal power. A change between laser powers (high duty cycle/low duty cycle) and/or a change between different spectral bandwidths is possible without a hysteresis in the respective achievable spectral bandwidth.

The beam-expanding optical unit can include at least one prism. The beam-expanding optical unit can include two prisms, three prisms, four prisms or even a greater number of prisms. The beam-expanding optical unit can include at least one mirror. The beam-expanding optical unit can include at least one cylindrical lens. The optical assembly and/or the laser, of which the optical assembly can be a component, can include a purging device for purging the optical components of the optical assembly and/or of the laser with a purge gas, for example nitrogen or helium. The purge gas can contribute to a heat dissipation of heat deposited on or in the optical components by residual absorption. However, thermally induced refractive index gradients in the purge gas can also contribute to a wavefront deformation themselves.

The beam width-limiting element can prevent radiation components which undesirably strike edge regions of the optical components in the optical assembly or which propagate through corresponding edge regions, which as a matter of principle do not meet sufficiently high desired properties for wavefront maintenance like the central region and which, moreover, have the greatest temperature gradients, from contributing to the used beam.

The beam-limiting stop can be a stop component that is separate from the other optical components of the optical assembly. As an alternative or in addition thereto, the beam-limiting stop can be formed by a coating, reflective at least in sections, of another component of the optical assembly, for example a component of the beam-expanding optical unit.

The optical assembly includes an additional input beam-limiting stop in the beam path of the resonator-internal laser beam on a side of the beam-expanding optical unit facing away from the grating. Such an additional input beam-limiting stop, which is arranged in the non-expanded part of the beam path of the resonator-internal laser beam, allows, in particular in conjunction with a tunable beam-expanding optical unit, an optimization of the expansion of the used region at the location of the beam-limiting stop which acts in the beam path of the expansion laser beam section. The arrangement of the input beam-limiting stop is such that there is an at least largely complete illumination of the beam-limiting stop in the case of a minimum expansion of the resonator-internal laser beam by way of the beam-expanding optical unit, which is tunable in such a case. The width of the additional input beam-limiting stop is chosen such that the beam-limiting stop arranged in the expansion laser beam section is overexposed by the resonator-internal laser beam and that the width of a used beam cross section on the grating is defined by the beam-limiting stop arranged in the expansion laser beam section.

The additional input beam-limiting stop ensures that the beam-limiting stop arranged in the expansion laser beam section is overexposed in practically all adjustment positions, apart from the one with the smallest expansion by the beam-expanding optical unit, such that the optical grating is impinged uniformly with intensity.

The beam-limiting stop can be embodied in such a way that it absorbs less than 5% of the energy of the resonator-internal laser beam incident thereon. Such a beam-limiting stop can avoid issues that may arise on account of heating of the beam-limiting stop itself by way of absorption. The beam-limiting stop can be configured in such a way that it absorbs less than 3%, or even less than 1%, of the resonator-internal laser beam incident thereon.

The beam-limiting stop can have, at least in sections, a transmissive embodiment for the resonator-internal laser beam. Such a transmitting embodiment of the beam-limiting stop can allow passed components of the resonator-internal laser beam, which do not contribute to further amplification in the laser resonator, to bring about a desirable heat influx in edge regions of the optical components of the optical assembly and/or of the laser, which can advantageously contribute to the reduction of temperature gradients in the used beam cross section. Overall, the beam-limiting stop can have a transmissive embodiment for the resonator-internal laser beam.

The beam-limiting stop can be embodied as at least one wedge plate. Such a wedge plate embodiment of the beam-limiting stop can allow the components of the resonator-internal radiation passing through the at least one wedge plate to be output coupled with a specified angle offset. This can be used, in particular, to guide the output coupled components in a targeted fashion for depositing heat by residual absorption in, in particular, optical components of the optical assembly and/or of the remaining laser that are adjacent to the beam-limiting stop. In particular, beam-limiting sections of the beam-limiting stop can be embodied as a wedge plate in each case.

The beam-limiting stop can be made of birefringent material such that it alters the polarization state of the resonator-internal laser beam passing therethrough in such a way that the latter is not amplified by the laser medium following the passage through the beam-limiting stop. Such a beam-limiting stop can, alternatively or additionally, change a polarization state of the resonator-internal laser beam and thus contribute to radiation that passes through the beam-limiting stop subsequently no longer being amplified in the laser medium. In this respect, the laser medium can generate a polarization-sensitive gain or a further polarization-optical component can be arranged in the resonator-internal beam path, the polarization-optical component acting as an analyzer and only passing laser radiation to be amplified. The beam-limiting stop or sections thereof can be embodied, for example, as a birefringent plate which, in particular, acts as a quarter wave plate.

The beam-limiting stop can have, at least in sections, a reflective em-bodiment for the resonator-internal laser beam. Such a reflective embodiment of the beam-limiting stop can protect at least certain regions of downstream optical units (optical unit mount, adhesive points) from the action of laser radiation by shadowing such that an unwanted absorption is avoided there, in particular. Overall, the beam-limiting stop can have a reflective embodiment for the resonator-internal laser beam. The beam-limiting stop can be realized by reflective plates and/or by a coating that is reflective, at least in sections. The beam-limiting stop can be embodied as a combination of diffractive and reflective components. A reflective beam-limiting stop can also be applied directly to an optical component of the assembly, e.g., to a prism of the beam-expanding optical unit. Such a coating can also have another function to a reflective one; i.e., it can generally have a stop effect as result of influencing the resonator-internal laser beam in such a way that it is no longer amplified by the laser medium following the action of the beam-limiting stop.

The beam-limiting stop can have a multi-part embodiment. Such an embodiment of the beam-limiting stop with offset beam-limiting sections can lead to a further increase in flexibility. The beam-limiting stop can have a two-part embodiment, or else an embodiment with a greater number of parts.

A first beam-limiting section of the beam-limiting stop can delimits the resonator-internal laser beam on a first side and a second beam-limiting section of the beam-limiting stop, which is arranged offset from the first beam-limiting section along the beam path of the expansion laser beam section, can delimit the resonator-internal laser beam on a side that is opposite to the first side. Such an embodiment of the beam-limiting stop with offset beam-limiting sections can lead to a further increase in flexibility. The thermal effects which by using the beam-limiting stop are caused, in particular, on components adjacent thereto in the beam path of the resonator-internal laser beam can be precisely specified in this way.

The beam-limiting stop can be arranged between the beam-expanding optical unit and the grating. Such an arrangement of the beam-limiting stop was found to be particularly suitable for precisely specifying a thermal load on the grating, in particular.

The width of the input stop and an adjustment range of the expansion factor of the beam-expanding optical unit can be matched to one another in such a way that the width of the resonator-internal laser beam, which is delimited by the beam-limiting stop, is independent of a tuning position of the beam-expanding optical unit during the passage through the beam-limiting stop. Such a tunable embodiment of the beam-expanding optical unit as proven its worth for specifying bandwidth in a targeted manner By way of example, such a tunable beam-expanding optical unit is known from U.S. Pat. No. 7,899,095 B2.

The width of the input stop and an adjustment range of the expansion factor of the beam-expanding optical unit can be matched to one another in such a way that the width of the resonator-internal laser beam, which is delimited by the beam-limiting stop, is independent of a tuning position of the beam-expanding optical unit during the passage through the beam-limiting stop. In such embodiments, the beam-expanding optical unit can be embodied in such a way that it acts only on the divergence of the resonator-internal laser beam and not on its cross section when changing the expansion factor in the beam path downstream of the beam-limiting stop.

In an aspect, the disclosure provides a bandwidth-limited laser, including: a laser medium; a resonator output-coupling mirror for the output beam; and an assembly according to the disclosure on the side of the laser medium that is opposite the resonator output-coupling mirror. The features of such a bandwidth-limited laser can correspond correspond to those that have already been explained above with reference to the optical assembly according to the disclosure. The laser can be an excimer laser. The laser can be an illumination laser for a microlithographic projection exposure apparatus, by which structured semiconductor components, for example semiconductor chips, can be produced.

The bandwidth-limited laser can be used as a light source in DUV semiconductor lithography. By way of example, a spectral bandwidth of the laser can be reduced by a factor of 1000 and can be tuned, depending on the embodiment, for setting a variable bandwidth, for example in the range between 0.15 pm and 0.6 pm (E95 width). The bandwidth-limited laser can serve as a seed laser which is amplified further for generating an exposure beam for DUV semiconductor lithography. Other applications of the laser, where a corresponding spectral bandwidth limitation is desired, are possible.

BRIEF DESCRIPTION OF THE DRAWINGS

Exemplary embodiments of the disclosure are explained in more detail below with reference to the drawings. In detail.

DESCRIPTION OF EXEMPLARY EMBODIMENTS

Figure 1:
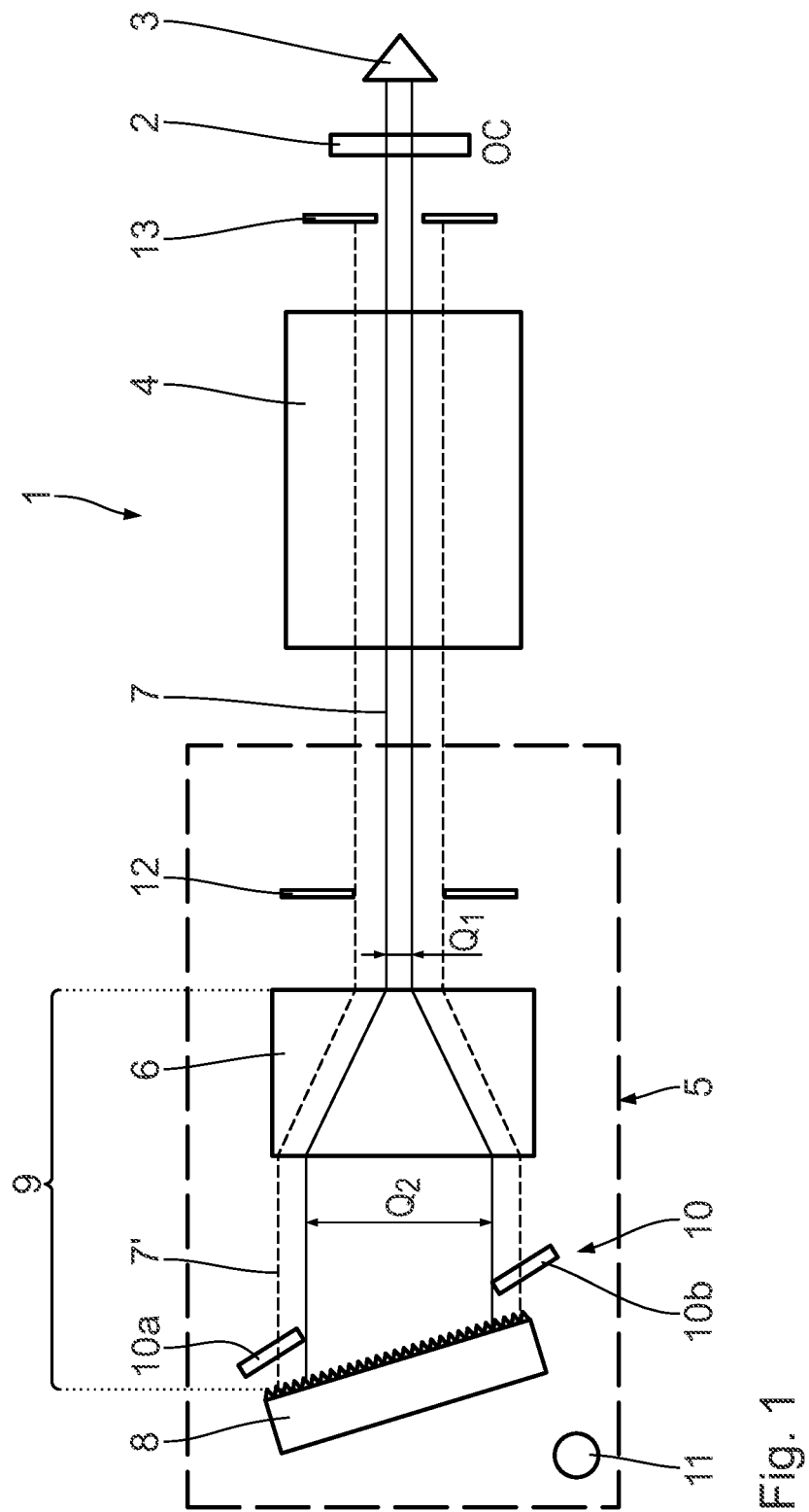
FIG. 1 shows a schematic view, with an expansion cross-sectional dimension of a resonator-internal laser beam lying in the plane of the drawing, a resonator of a bandwidth-limited excimer laser with a beam-limiting stop acting in the expansion cross-sectional dimension as part of an optical assembly for reducing a spectral bandwidth of an output beam of the laser.

An excimer laser 1, illustrated schematically in FIG. 1, includes a resonator with an output-coupling mirror 2, which has a partly transmissive embodiment for an output beam 3 of the laser 1, and, on the side of a laser medium 4 opposite to the output-coupling mirror 2, an optical assembly 5 for reducing a spectral bandwidth of the output beam 3. The optical assembly 5 additionally has the function of a second resonator mirror of the resonator of the laser 1.

The optical assembly 5 includes a beam-expanding optical unit 6, arranged within the laser resonator, for increasing a beam cross section of a resonator-internal laser beam 7 in an expansion cross-sectional dimension, specifically the cross-sectional dimension of the resonator-internal laser beam 7 that coincides with the plane of the drawing of FIG. 1.

The beam-expanding optical unit 6 includes a series of optical components, for example prisms P1, P2, . . . , for a beam expansion. These prisms P1, P2, . . . are arranged between the laser medium 4 and an optical grating 8. The optical grating 8 is in a retroreflective arrangement for the resonator-internal laser beam 7.

The resonator-internal laser beam 7 has a non-expanded beam cross section $Q_1$ in the resonator beam path between the laser medium 4 and the first prism P1 of the beam-expanding optical unit 6 and has an increased beam cross section $Q_2$ in comparison therewith at the retroreflection of the optical grating 8. In comparison with the resonator-internal laser beam 7, the divergence in the expansion direction is reduced between the beam-expanding system 6 and the grating 8. Between the first prism P1 of the beam-expanding optical unit 6 and the grating 8 there is an expansion laser beam section 9 of the resonator-internal laser beam 7, in which the beam cross section of the resonator-internal laser beam 7 is greater than $Q_1$ in the expansion cross-sectional dimension.

The optical assembly 5 includes a beam-limiting stop 10 with beam-limiting sections 10a, 10b in the beam path of the expansion laser beam section 9. The beam-limiting stop 10 acts in the expansion cross-sectional dimension in such a way that a used beam cross section of the resonator-internal laser beam 7 passed by the beam-limiting stop 10 is smaller in the expansion cross-sectional dimension than a beam cross section in the expansion cross-sectional dimension that would be present without the beam-limiting stop 10. Thus, the beam-limiting stop 10 leads to a constriction of the resonator-internal laser beam 7 in the expansion cross-sectional dimension.

All portions of the resonator of the laser 1 with optical components are purged with a suitable purge gas, for example nitrogen or helium, using a purging device 11 illustrated very schematically in FIG. 1 in order to reduce absorption by the purge gas atmosphere itself and a contamination of the surfaces and in order to dissipate heat, which, for example is deposited on the components as a result of residual absorption there.

The beam-limiting stop 10 has a multi-part embodiment according to FIG. 1 and includes a beam-limiting section 10a which delimits the resonator-internal laser beam 7 from the top in FIG. 1 and a second beam-limiting section 10b which delimits the resonator-internal laser beam 7 from the bottom in FIG. 1. Thus, the two beam-limiting sections 10a, 10b delimit the resonator-internal laser beam 7 from opposing sides in the expansion cross-sectional dimension.

The beam-limiting stop 10 is embodied in such a way that it absorbs less than 5% and, in particular, less than 1% of the energy of the masked cross section of the resonator-internal laser beam 7 incident thereon. The beam-limiting stop 10 has a transmissive embodiment, i.e., passes the resonator-internal laser beam, at least in sections, and acts on the passed components of the resonator-internal laser beam 7 in such a way that these passed components are no longer amplified in the laser medium 4. The two beam-limiting sections 10a, 10b can be embodied as wedge plates and thus lead to an angular deflection of the components of the resonator-internal laser beam 7 passing therethrough. This angular deflection can be very small and need only be so large that these deflected components of the resonator-internal laser beam 7 are no longer amplified in the laser medium 4 following retroreflection at the grating 8. The beam-limiting stop 10 can moreover have a reflective embodiment, in sections, for the resonator-internal laser beam 7 and, to this end, it has a corresponding reflecting coating in sections. These reflecting sections eliminate, by casting a shadow, e.g., edge regions of the beam cross section which should not be incident on at least certain regions of downstream optical units.

As an alternative or in addition to a beam-deflecting or reflecting effect, the beam-limiting stop 10 can also have a polarization-optical effect and thus influence components of the resonator-internal laser beam 7 in such a way that these are no longer amplified in the laser medium 4.

The greater the beam diameter $Q_2$ and/or the smaller the divergence DIV1, the smaller the spectral bandwidth of the output beam 3. The basic function of an optical assembly for reducing a spectral bandwidth of an output beam of a laser with a beam-expanding optical unit and an optical grating is known from U.S. Pat. No. 6,496,528 B2, U.S. Pat. No. 7,899,095 B2, and U.S. Pat. No. 8,379,687 B2.

The width of the beam cross section $Q_1$ of the resonator-internal laser beam 7 is defined by two further aperture stops 12, 13, firstly between the first prism P1 of the beam-expanding optical unit 6 and the laser medium 4 and, secondly, between the laser medium 4 and the output-coupling mirror 2. The stop 12 is defined by the width of the beam entering the assembly 5.

In FIG. 1, this is shown by an additional, dashed beam path 7'. Full lines are used to illustrate the used beam width of the resonator-internal laser beam 7 defined by the stop 10. Dashed lines are used to illustrate the beam width, defined by the stop 12, which leads to an overexposure of the internal stop 10 following expansion.

To set the size of the cross section $Q_2$ and/or the divergence and, accordingly, to set the spectral bandwidth of the output beam 3, the first prism P1 in the beam-expanding optical unit 6 can be designed to be displaceable and, in particular, tiltable about a tilt axis perpendicular to the plane of the drawing in FIG. 1. The adjustment range of the beam-expanding optical unit 6 and the width of the input aperture 12 can be matched to one another in such a way that the beam-limiting stop 10 is approximately completely illuminated in the case of the smallest expansion and is completely overexposed with increasing expansion, and so the same used beam width is present at the optical grating independently of a bandwidth tuning position of the beam-expanding optical unit.

Thus, at the location of the beam-limiting stop 10, a change in the tuning position of the beam-expanding optical unit 6 only leads to change in the divergence of the resonator-internal laser beam 7, and not to change in the cross section of the used cross section in the expansion cross-sectional dimension.

A special embodiment of an optical assembly 14, which can be used in the laser 1 instead of the optical assembly 5, is described below on the basis of FIG. 2. Components and functions corresponding to those which have already been explained above with reference to FIG. 1 bear the same reference signs and will not be discussed in detail again.

In the optical assembly 14, the beam-expanding optical unit 6 has a total of four prisms P1, P2, P3, and P4, which each expand the beam cross section of the resonator-internal laser beam 7 in the expansion laser beam section 9, located between the prism P1 and the optical grating 8, in the expansion cross-sectional dimension. An expansion factor which reproduces the expansion of the resonator-internal laser beam 7 by the respective prism P1 to P4 in the expansion cross-sectional dimension can range between 1.5 and 5 per prism, and could be 3, for example. The divergence of the resonator-internal laser beam 7 reduces in accordance with the expansion of the resonator-internal laser beam 7.

The assembly 14 additionally has a deflection mirror M in the beam path of the resonator-internal laser beam 7, between the prism P4 and the grating 8. The two beam-limiting sections 10a, 10b of the beam-limiting stop 10 of the optical assembly 14 are arranged offset to one another along the beam path of the resonator-internal laser beam 7 in the expansion laser beam section. This offset is such that the light path of the resonator-internal laser beam 7 from the respective beam-limiting section 10a or 10b to the grating 8 is approximately of the same length.

Figure 2:
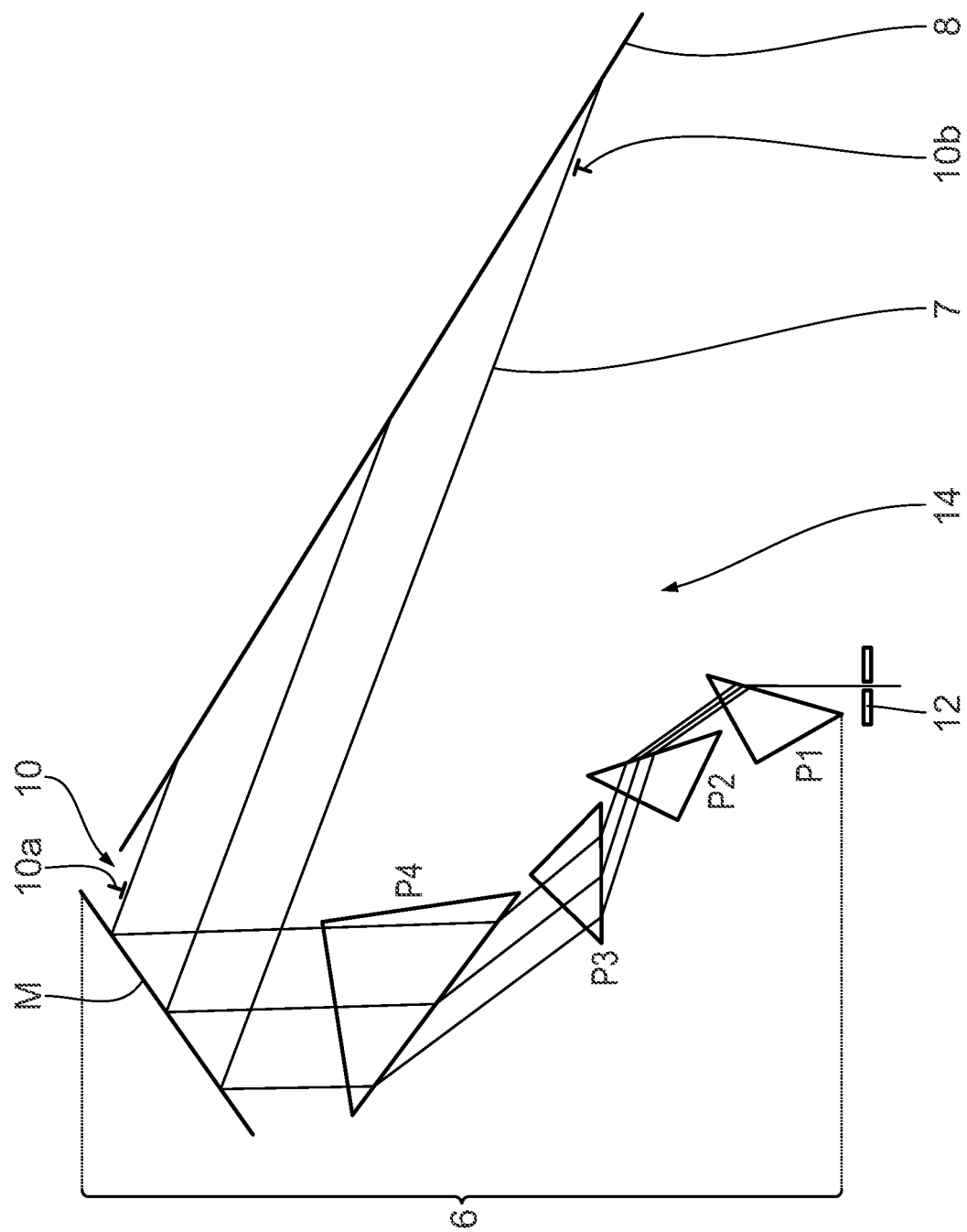
FIG. 2 shows a specific embodiment of an optical assembly for reducing the spectral bandwidth of the output beam of a laser, which can be used in place of the optical assembly according to FIG. 1.
Figure 3:
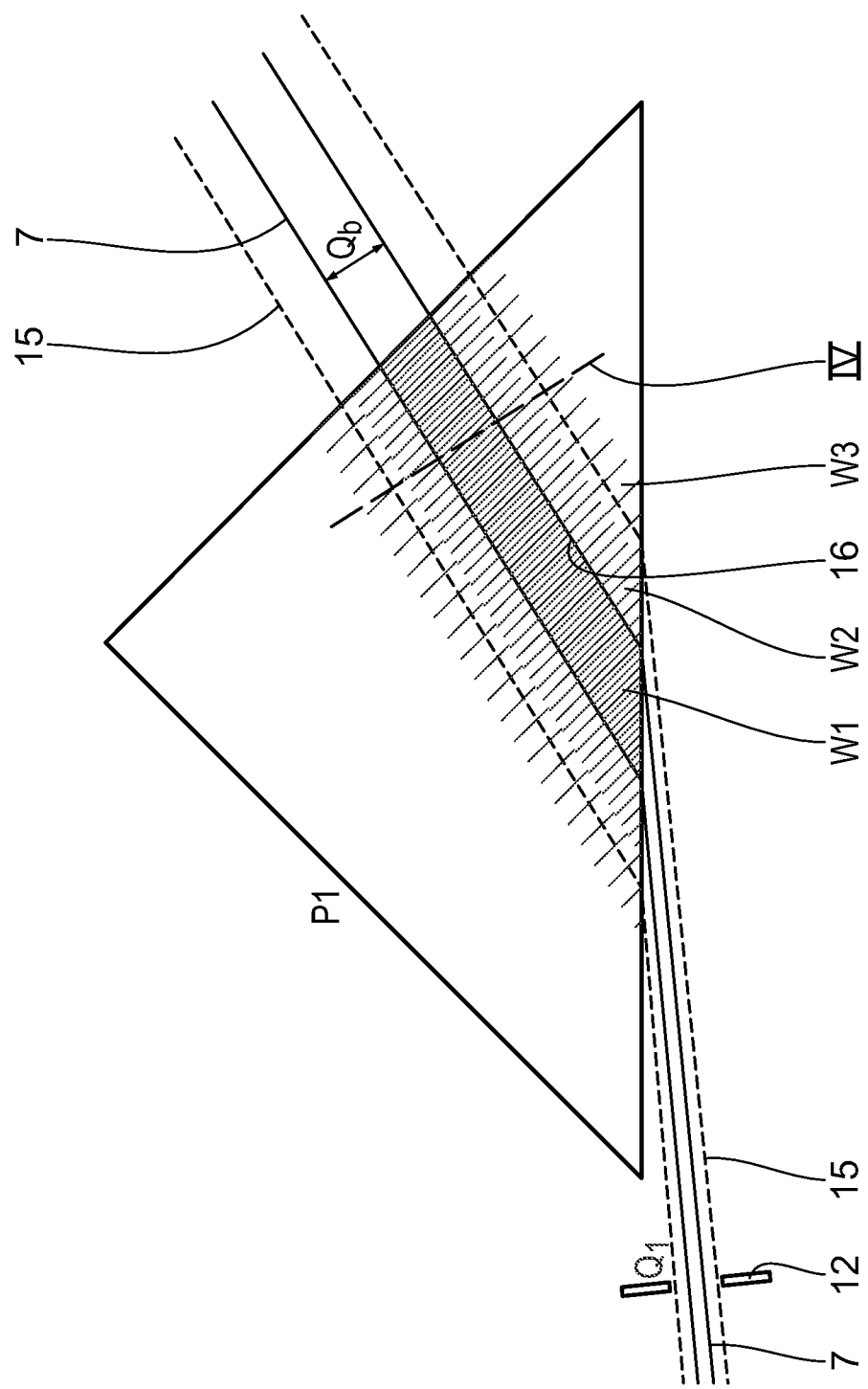
FIG. 3 shows a prism of a beam-expanding optical unit of the optical assembly according to FIG. 2, for the purposes of elucidating a thermal effect of the beam-limiting stop of the optical assembly according to FIG. 2.
Figure 4:
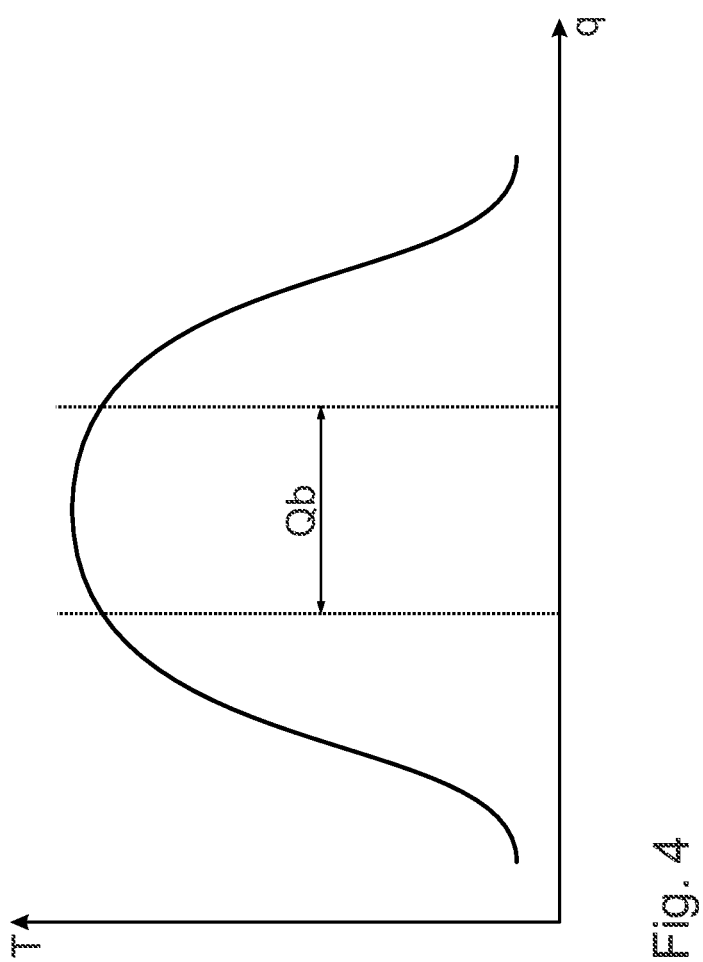
FIG. 4 shows a diagram of a temperature profile of the prism according to FIG. 3, as seen in the plane IV of FIG. 3, i.e., as seen perpendicular to the resonator-internal laser beam running through the prism.

FIGS. 3 and 4 elucidate the effect of the beam-limiting stop 10 on a thermal homogenization, in particular, of the optical properties in the used region of the resonator-internal laser beam 7. This is illustrated in simplified fashion on the basis of prism P1 of the beam-expanding optical unit 6, with the effect being comparable, in principle, for a stringing together of prisms P2, P3, and P4 (like in the embodiment according to FIG. 2).

On account of the effect of the beam-limiting stop 10, a beam cross section $Q_1$ which starts off wider in the expansion cross-sectional dimension (cf. the dashed beam-bounding profile 15 in FIG. 3 or the dashed profile 7' in the case of a stringing together of optical units in FIG. 1) is restricted to the beam cross section $Q_b$ of the actual used region of the resonator-internal laser beam 7.

When the resonator-internal laser beam 7 travels from the laser medium 4 through the input stop 12 and the prism P1, the entire input cross section corresponding to the beam-bounding profile 15 contributes to the heating of the prism P1 on account of residual absorption. This heating along a passage channel 16 of the laser radiation through the prism P1 is illustrated in FIG. 3 in a plurality of heat influx zones W1, W2 and W3.

In the central heat influx zone W1 along the passage channel 16, i.e., within the actual used beam cross section $Q_b$, there is a substantially constant temperature increase without temperature gradients. This approximately constant temperature increase is additionally elucidated in FIG. 4, which shows the temperature profile of the prism P1 in the cross section (transverse dimension q) of the resonator-internal laser beam 7.

There then is a gradual decrease in the introduced heat in the heat influx zone W2 adjoining laterally on both sides and in the outer heat influx zone W3 laterally adjoining this in turn. Thus, there is a temperature gradient in the heat influx zones W2, W3.

Since the entire cross section within the beam-bounding profile 15 contributes to the heat influx in the passage channel 16 during the passage from the laser medium 4 through the prism P1, the central heat influx zone W1 arises without any noteworthy temperature gradient. Thus, the prism P1 does not lead to a disturbance of the wavefront of the beam propagation in the used region of the resonator-internal laser beam 7 during the passage through the prism P1 since this used region only passes through the heat influx zone W1 without any noteworthy temperature gradient.

In the case of the embodiment of the beam-limiting stop 10 as transmissive wedge plates with a weak angular deflection, the returning part of the resonator-internal radiation not belonging to the used region, i.e., the part of the resonator-internal radiation reflected by the grating 8, can also still contribute to the heating of the prism P1 in the heat influx zones W2, W3 and thus desirably keep the temperature gradient in the central heat influx zone W1 at a minimum.

In FIG. 2, the resonator-internal laser radiation impinges on the prisms P1 to P4, the mirror M, and also the grating 8 with a greater cross-sectional area than the extent of the used region of the resonator-internal laser beam in the expansion cross-sectional dimension. This also applies, in particular, to the grating 8 since the beam-limiting sections 10a, 10b in the beam path of the resonator-internal laser beam 7 are arranged only a short beam path upstream of the incidence of the resonator-internal laser radiation on the grating 8 such that the angular deflection by the wedge plate embodiment of the beam-limiting sections 10a, 10b only has a negligible influence on the location of incidence of the radiation, which is angle-offset and transmitted by the beam-limiting sections 10a, 10b, on the grating 8.

Figure 5:
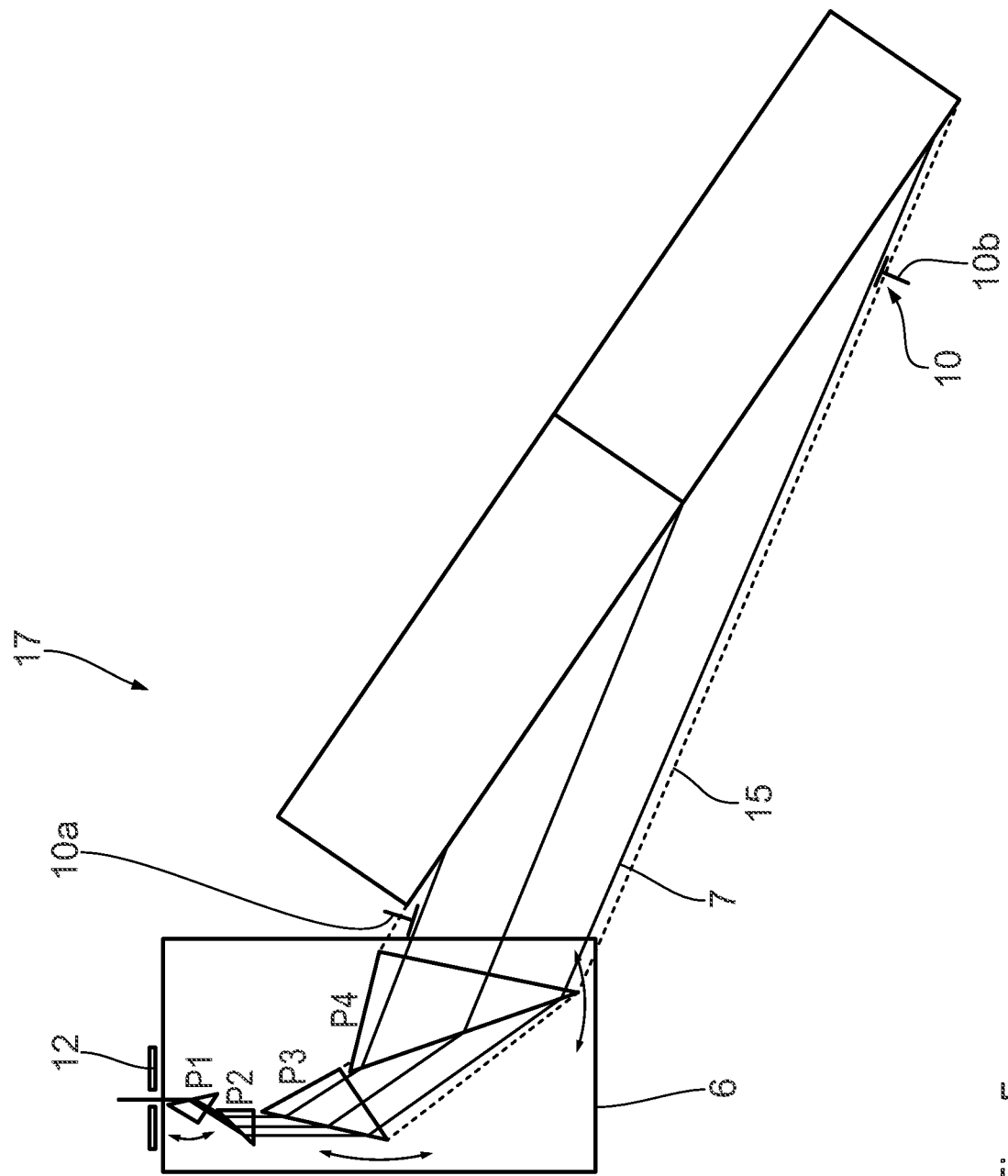
FIG. 5 shows, in an illustration similar to FIG. 2, a further embodiment of an optical assembly for reducing the spectral bandwidth of the output beam of a laser, which can be used in place of the optical assembly according to FIG. 1.

A further embodiment of an optical assembly 17, which can be used in the laser 1 instead of the optical assemblies 5 or 14, is described below on the basis of FIG. 5. Components and functions corresponding to those which have already been explained above with reference to FIGS. 1 to 3 bear the same reference signs and will not be discussed in detail again.

In the optical assembly 17, the beam-expanding optical unit 6 once again includes four prisms P1, P2, P3, and P4. The first prism P1, in particular, has a tiltable embodiment in order to specify the spectral bandwidth of the laser 1. Furthermore, prisms P3 and P4 have a tiltable embodiment in order to specify a central wavelength of the output beam 3.

A corresponding embodiment of the beam-expanding optical unit 6 of the assembly 17 is described in U.S. Pat. No. 7,899,095 B2.

If the beam-width limitation in the assembly 17 is implemented only by an input stop 12, a change in the beam expansion by rotating P1 leads to a changeable width of the illumination on the grating. When changing the beam expansion from the minimum to the maximum value there is—on account of the poor thermal conduction of the grating substrate—only a very slow equalization of the impressed, inhomogeneous temperature distribution. This has as a consequence a significant disturbance in the wavefront, which is an obstacle to the sought-after fast change from a large to a small bandwidth, especially if the laser 1 is operated at a high laser power. In the case of a significant limitation of the used beam width by an internal stop 10 and in the case of suitable matching of the width of the input stop 12 and the internal stop 10, it is possible to keep the width of the illumination of the grating largely constant, independently of the expansion factor. A variation of the expansion factor by rotating P1 then only has an effect on the divergence of the incident beam, without a significant change in the width of the illumination on the grating.

The beam guidance of the resonator-internal laser beam 7 through the optical components of the optical assembly 17, which generally has a very low temperature gradients in the case of the beam limitation with the aid of the internal stop 10, and the avoidance of a temperature distribution on the grating that changes with the expansion allows, in particular, a change between high and low spectral bandwidth to be carried out even if the laser 1 is operated at a high laser power, wherein, in particular, the change between a maximum value and a minimum value of the spectral bandwidth can be implemented substantially without hysteresis.

What is claimed is:

1. An optical assembly, comprising:
a beam-expanding optical unit within a laser resonator, the beam-expanding optical unit configured to increase a beam cross section and reduce a divergence of a resonator-internal laser beam in an expansion cross-sectional dimension so that a resonator-internal expansion laser beam section arises;
an optical grating in a retroreflective arrangement for the resonator-internal laser beam;
a first beam-limiting stop in a beam path of the expansion laser beam section, the first beam-limiting stop configured to act in the expansion cross-sectional dimension; and
a second beam-limiting stop in a beam path of the resonator-internal laser beam on a side of the beam-expanding optical unit facing away from the grating,
wherein:
a width of the second beam-limiting stop is such that the first beam-limiting stop is overexposed by the resonator-internal laser beam and such that a width of a used beam cross section on the grating is defined by the first beam-limiting stop; and
an adjustment range of the beam-expanding optical unit and a width of an input aperture of the second beam-limiting stop are matched to one another so that the first beam-limiting stop is fully illuminated in a case of an expansion and the first beam-limiting stop is overexposed with an increasing expansion.

2. The assembly of claim 1, wherein the first beam-limiting stop is configured to absorb less than 5% of an energy of the resonator-internal laser beam incident on the first beam-limiting stop.

3. The assembly of claim 1, wherein at least sections of the first beam-limiting stop are transmissive for the resonator-internal laser beam.

4. The assembly of claim 3, wherein the first beam-limiting stop comprises a wedge plate.

5. The assembly of claim 1, wherein the first beam-limiting stop comprises birefringent material configured to alter a polarization state of the resonator-internal laser beam passing through the first beam-limiting stop so that the resonator-internal laser beam is not amplified by a laser medium after passing through the first beam-limiting stop.

6. The assembly of claim 1, wherein at least sections of the first beam-limiting stop are reflective for the resonator-internal laser beam.

7. The assembly of claim 1, wherein the first beam-limiting stop comprises multiple parts.

8. The assembly of claim 7, wherein:
a first section of the first beam-limiting stop is configured to delimit the resonator-internal laser beam on a first side;
a second section of the first beam-limiting stop is offset from the first section of the first beam-limiting stop along the beam path of the expansion laser beam section; and
the second section of the first beam-limiting stop is configured to delimit the resonator-internal laser beam on a side opposite to the first side.

9. The assembly of claim 1, wherein the first beam-limiting stop is between the beam-expanding optical unit and the grating.

10. The assembly of claim 1, wherein an expansion factor of the beam-expanding optical unit is tunable to prescribe a bandwidth of an output beam.

11. The assembly of claim 10, wherein the width of the input aperture and an adjustment range of the expansion factor of the beam-expanding optical unit are matched to one another so that the width of the resonator-internal laser beam, which is delimited by the first beam-limiting stop, is independent of a tuning position of the beam-expanding optical unit when resonator-internal laser beam passes through the first beam-limiting stop.

12. The assembly of claim 1, wherein:
the first beam-limiting stop is configured to absorb less than 5% of an energy of the resonator-internal laser beam incident on the first beam-limiting stop; and
at least sections of the first beam-limiting stop are transmissive for the resonator-internal laser beam.

13. The assembly of claim 1, wherein:
the first beam-limiting stop is configured to absorb less than 5% of an energy of the resonator-internal laser beam incident on the first beam-limiting stop; and
the first beam-limiting stop comprises birefringent material configured to alter a polarization state of the resonator-internal laser beam passing through the first beam-limiting stop so that the resonator-internal laser beam is not amplified by a laser medium after passing through the first beam-limiting stop.

14. The assembly of claim 1, wherein:
the first beam-limiting stop is configured to absorb less than 5% of an energy of the resonator-internal laser beam incident on the first beam-limiting stop; and
at least sections of the beam-limiting stop are reflective for the resonator-internal laser beam.

15. The assembly of claim 1, wherein:
the first beam-limiting stop is configured to absorb less than 5% of an energy of the resonator-internal laser beam incident on the first beam-limiting stop; and
the first beam-limiting stop comprises multiple parts.

16. The assembly of claim 1, wherein:
the first beam-limiting stop is configured to absorb less than 5% of an energy of the resonator-internal laser beam incident on the first beam-limiting stop; and
the first beam-limiting stop is between the beam-expanding optical unit and the grating.

17. The assembly of claim 1, wherein:
the first beam-limiting stop is configured to absorb less than 5% of an energy of the resonator-internal laser beam incident on the first beam-limiting stop; and
an expansion factor of the beam-expanding optical unit is tunable to prescribe a bandwidth of an output beam.

18. A laser, comprising:
a laser medium;
a resonator output-coupling mirror for an output beam; and
an assembly according to claim 1, the assembly on a side of the laser medium opposite the resonator output-coupling mirror.

* * * * *

UNITED STATES PATENT AND TRADEMARK OFFICE
CERTIFICATE OF CORRECTION

PATENT NO. : 12,300,959 B2
APPLICATION NO. : 17/117824
DATED : May 13, 2025
INVENTOR(S) : Johannes Kraus, Oliver Gloeckl and Markus Deubel Page 1 of 1

It is certified that error appears in the above-identified patent and that said Letters Patent is hereby corrected as shown below:

In the Specification

Column 1, Line 10, delete "PCT/EP 2019/063857," insert -- PCT/EP2019/063857, --.

Column 4, Line 32, delete "em-bodiment" and insert -- embodiment --.

Column 5, Line 17, after "manner" insert -- . --.

Column 5, Line 37, delete "correspond correspond" and insert -- correspond --.

Signed and Sealed this
Twenty-fourth Day of June, 2025

Coke Morgan Stewart
*Acting Director of the United States Patent and Trademark Office*